(12) United States Patent
Schauer

(10) Patent No.: US 8,333,939 B2
(45) Date of Patent: Dec. 18, 2012

(54) HIGH TEMPERATURE OPTICAL SENSOR DEVICE FOR SUBSTRATE FABRICATION EQUIPMENT

(75) Inventor: Ronald Vern Schauer, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1797 days.

(21) Appl. No.: 11/561,118

(22) Filed: Nov. 17, 2006

(65) Prior Publication Data

US 2007/0129827 A1 Jun. 7, 2007

Related U.S. Application Data

(60) Provisional application No. 60/738,077, filed on Nov. 17, 2005.

(51) Int. Cl.
*G01N 33/00* (2006.01)
(52) U.S. Cl. .......................... 422/566; 422/500; 422/565
(58) Field of Classification Search .................. 422/500, 422/565, 566
See application file for complete search history.

(56) References Cited

U.S. PATENT DOCUMENTS 4,711,579 A * 12/1987 Wilkinson .................... 356/615

FOREIGN PATENT DOCUMENTS

| KR | 10-2007-0060797 A | 6/2007 |
| KR | 10-0738960 B1 | 7/2007 |

OTHER PUBLICATIONS

Office Action of Taiwan Patent Application No. 095220199 issued Jul. 16, 2007.
Office Action of China Patent Application No. 200620157989.8 issued Jul. 20, 2007.
Office Action of South Korea Patent Application No. 20-2006-0029878 dated Nov. 26, 2007.

* cited by examiner

*Primary Examiner* — Sam P Siefke
(74) *Attorney, Agent, or Firm* — Dugan & Dugan, PC

(57) ABSTRACT

Methods and apparatus for sensing a substrate in a high temperature environment are provided. The invention includes a support frame having one or more apertures; one or more optical devices positioned in and aligned by the one or more apertures and adapted to detect an edge of a substrate. The invention may also include a controller secured adjacent an end of the support frame, coupled to the one or more optical devices, and adapted to receive information from the optical devices, process the information, and determine a center of a substrate based on the processed information. The support frame may be adapted to thermally shield the one or more optical devices and the controller. Numerous other aspects are provided.

11 Claims, 4 Drawing Sheets

US 8,333,939 B2

HIGH TEMPERATURE OPTICAL SENSOR DEVICE FOR SUBSTRATE FABRICATION EQUIPMENT

CROSS-REFERENCE TO RELATED APPLICATIONS

The present invention claims the benefit of U.S. Provisional Application Ser. No. 60/738,077, filed on Nov. 17, 2005 and entitled "HIGH TEMPERATURE OPTICAL SENSOR DEVICE FOR WAFER FABRICATION EQUIPMENT", which is hereby incorporated herein by reference.

FIELD OF THE INVENTION

The present invention relates generally to optical sensors, and more particularly to methods and apparatus for high temperature fiber optics for placement of sensitive optical devices.

BACKGROUND

Conventional systems, in the placement of optical sensors, typically place plastic-cased optical emitters and detectors at locations surrounding an opening through which the processed substrate may pass. The emitters and detectors, therefore, may be exposed to intense direct radiant heating from passing substrates which may damage these devices. Accordingly, effective methods and apparatus for the placement and nature of optical sensors are desired.

SUMMARY OF THE INVENTION

In a first aspect of the invention, an apparatus for sensing a substrate in a high temperature environment is provided. The apparatus includes a support frame having one or more apertures, one or more optical devices positioned in and aligned by the one or more apertures and adapted to detect an edge of a substrate. The apparatus also includes a controller secured adjacent an end of the support frame, coupled to the one or more optical devices, and adapted to receive information from the optical devices, processing the information, and determining a center of a substrate based on the processed information, wherein the support frame is adapted to thermally shield the one or more optical devices and the controller.

In a second aspect of the invention, a method for sensing a substrate in a high temperature environment is provided. The method includes providing an apparatus which includes a support frame having one or more apertures, positioning and aligning one or more optical devices by the one or more apertures, and adapting one or more optical devices to detect an edge of a substrate. The method further provides securing a controller adjacent to an end of the support frame, coupling the controller to the one or more optical devices, which is adapted to receive information from the optical devices, processing the information, and determining a center of a substrate based on the processed information so as to thereby locate a substrate in a high temperature environment.

Other features and aspects of the present invention will become more fully apparent from the following detailed description, the appended claims and the accompanying drawings.

DETAILED DESCRIPTION

The present invention is directed to methods and apparatus for improved substrate centerfinding (e.g., locating the center of a substrate) in substrate transfer chambers with high temperature conditions. In some embodiments, the apparatus may include a support frame, which may position, align, optically shield, and/or thermally shield componentry (e.g., optical emitters, optical sensors, wiring, etc.) housed within the frame. The shielded componentry, such as optical emitters and optical sensors, may be used for substrate positioning operations such as center and/or edge finding. The support frame may allow the shielded componentry to be aligned precisely and improve positional accuracy and substrate center determinations. Adjacent, attached to, or disposed remotely from the support frame may be control circuitry (e.g., electronic logic boards, single-chip microcontrollers, microprocessors, etc.) for optical signal comparison, size selection routines, calibration functions, componentry control and/or other appropriate functions. In some embodiments, the control circuitry is positioned at an end of the support frame so as to prevent the control circuitry from being in proximity to hot substrates which radiate heat that may damage the control circuitry. In some embodiments, the support frame may be secured to a substrate transfer chamber using thermally conductive brackets, which may effectively help pass heat energy from a sensor frame to the surrounding structure so as to help dissipate heat to maintain relatively low temperatures within the body of the support frame and the sensor circuitry.

Figure 1:
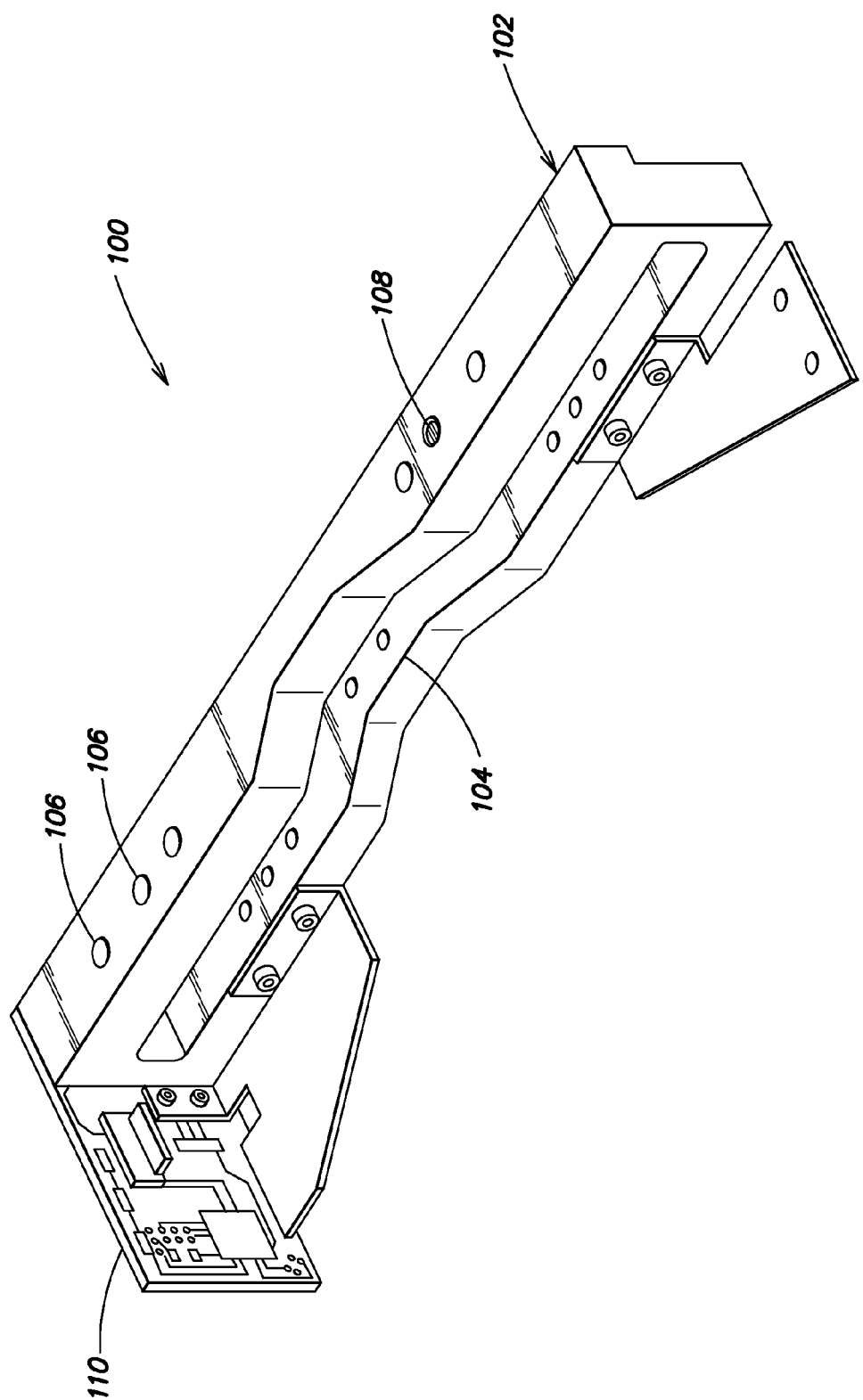
FIG. 1 is a front perspective view of an example embodiment of the apparatus of the present invention.

FIG. 1 illustrates a front perspective view of an embodiment of the apparatus of the present invention which is designated generally by the reference numeral 100. As shown in FIG. 1, the apparatus 100, in an exemplary embodiment, may include a support frame 102 which has a cut away region 104 such that a substrate may be passed therethrough. As further illustrated in FIG. 1, the support frame 102 may have one or more apertures 106 for housing and/or exposing optical componentry 108 such as optical sensors and/or optical emitters. Also, a controller 110 is shown which may be secured adjacent an end of the support frame 102.

The support frame 102 may be constructed of any appropriate material, such as aluminum, stainless steel, titanium, and/or ceramic. Other materials may be used. The support frame 102 may also be plated and/or coated to improve at least the heat reflectivity of the support frame 102. Exemplary platings and/or coatings include, but are not limited to, metal plating such as 24K gold plating, ceramic coating, reflective plating, anodizing, and/or painting. In some embodiments, the support frame 102 may have a shape that substantially conforms to the profile of an inner transfer chamber wall. In some embodiments, the frame 102 may be approximately 9" long by 1¾" high with a cut away region 104 approximately 8¾" long by ½" high. Such dimensions may be suitable for 200 millimeter substrates. Other dimensions may be used. In particular, for example, dimensions practicable for a 300 millimeter substrate may be used (e.g., a frame 102 with a cut away region 104 approximately 12¾" by ½" high).

In operation, a substrate may be passed through the apparatus 100 (e.g., through the cut away region 104 in the support frame 102) when it is passed into or out of a transfer or other chamber. When the support frame 102 is positioned within a transfer chamber, the cut away region 104 may be coincident or aligned with the transfer chamber's slit valve. Accordingly, the support frame 102 may be of appropriate size and shape so as to fit adjacent the inner chamber wall of a transfer chamber without extending into the space reserved for a substrate elevator and/or robot, and/or substrate holding/moving areas.

In some embodiments, a number of apertures (e.g., seven) disposed in a line or other spaced pattern may be available on the upper portion of the support frame 102 and additional corresponding apertures 106 may be available on the lower portion of the support frame 102. Although seven apertures 106 are depicted on the apparatus 100 in FIG. 1, any practicable number of apertures may be provided (e.g., 1, 2, 3, etc.). The apertures 106 may be used for housing optical componentry 108 responsible for finding the leading and/or trailing tangent point of a substrate as the substrate is passed through the cut away region 104. In some embodiments, the outside pairs of apertures 106 may be used for housing optical componentry 108 responsible for locating the outer edge of the substrate. For example, the innermost pairs (e.g., the upper and lower apertures on both the left and right sides that are closest to the center apertures) may be used to find the edges of a five inch substrate. The outermost pairs may be used to find the edges of an eight inch substrate. The pairs between the innermost pairs and outermost pairs may be used to find the edges a six inch substrate. Any other appropriate spacing (e.g., location of aperture pairs) to determine the edge of any size or type of substrate may be used. The invention may be used with any type of substrate (e.g., semiconductor wafers, glass plate for flat panel displays, etc.).

The optical componentry 108 may include optical emitters and optical sensors used in tandem to determine the presence or absence of a transmitted optical signal which may indicate the presence of a substrate (e.g., via transmission or reflection). Additionally or alternatively, high temperature fiber optics (e.g., plastic, glass, or fiber bundles) and/or image pipes may be used. Any other appropriate optical or other componentry may be used to detect the presence and/or absence of a substrate as it passes through the support frame 102. Optical componentry 108 may be precisely aligned and/or positioned by placement in apertures 106 within the support frame 102. Additionally or alternatively, the support frame 102 may be molded around optical componentry 108 and/or optical componentry 108 may be integral in the construction of the support frame 102.

As mentioned above, in some embodiments, a controller 110 may be secured adjacent an end of the support frame 102. Additionally or alternatively, the controller 110 may be located at another location within the substrate transfer chamber, positioned at another location adjacent the support frame 102, and/or located outside the substrate transfer chamber. In an exemplary embodiment, the controller 110 may be spaced apart from an area that may contain substrates by about one inch or more. The controller 110 may be an electronic logic board, microcontroller such as a single-chip microcontroller, microprocessor, or the like. The controller 110 may be adapted to provide automatic calibration and/or size selection for the inventive apparatus 100 and/or facilitate the detection and calculation of the center location of a substrate.

Figure 2:
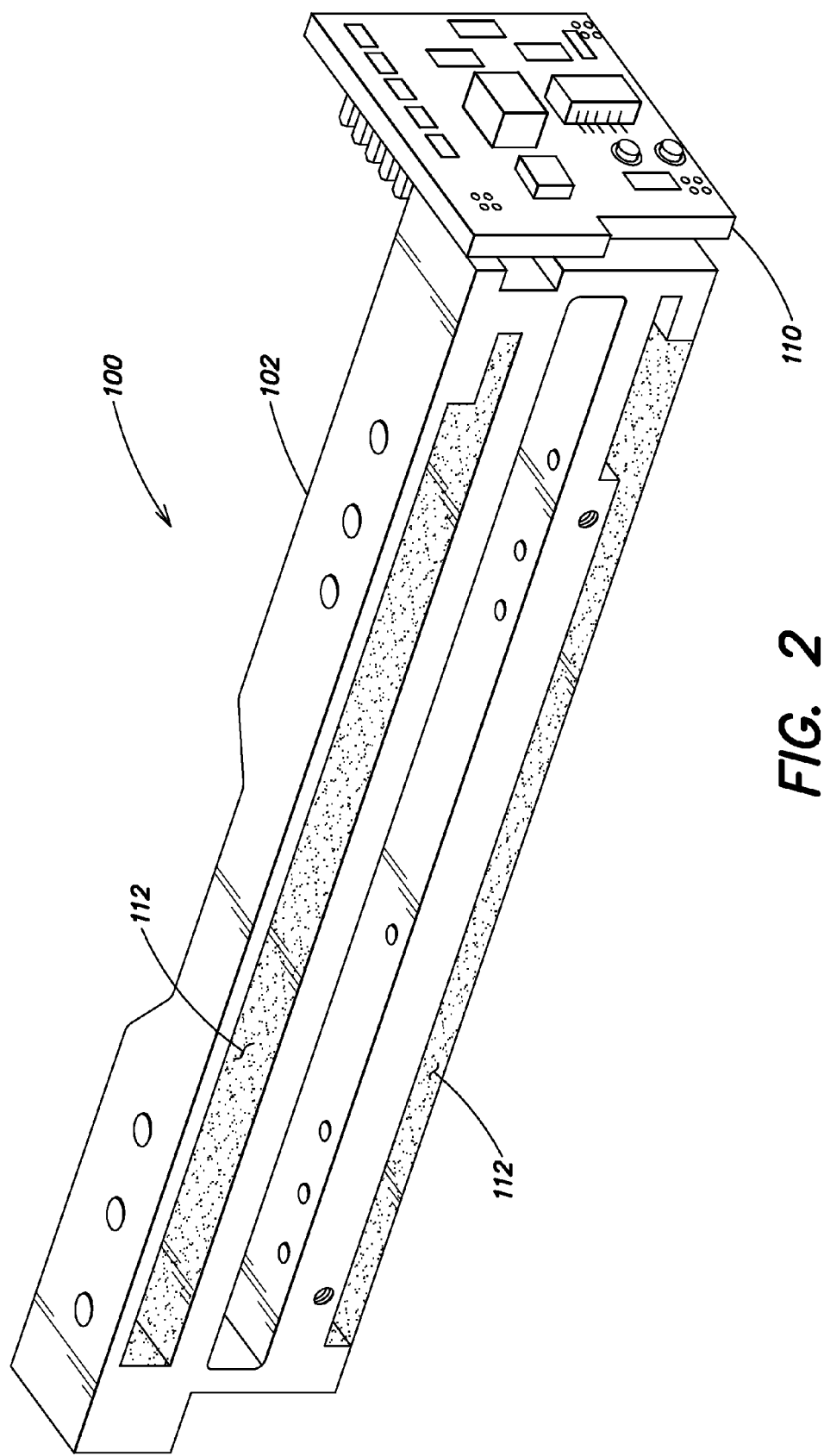
FIG. 2 is a rear perspective view of an example embodiment of the apparatus of the present invention.

Turning to FIG. 2, a rear perspective view of an embodiment of the apparatus of the present invention is illustrated. The optical componentry 108 (FIG. 1) may be electrically coupled to the controller 110 through wiring channels 112, which may be, for example, potted with an opaque encapsulation material and/or other heat and/or light shielding material. The optical and/or electrical componentry 108 housed within the apertures 106 may be connected to the controller 110 via wiring housed within the support frame 102. The wiring channels 112 may be disposed with the support frame 102 and accessible from the rear of the support frame 102, as shown in FIG. 2. For example, wiring, electrical componentry, and/or optical componentry may be potted in the support frame 102 with an encapsulation material (or otherwise secured within the support frame 102). The particular encapsulation material used is preferably capable of withstanding high radiant heat temperatures and shielding componentry contained within the encapsulation material from the damaging effects of heat. Exemplary encapsulation materials include commercially available products, such as Torr-Seal, manufactured by Varian, Inc. of Palo Alto, Calif., Marine Grade Epoxy, manufactured by Tap Plastics of Dublin, Calif., HT Epoxy, manufactured by Master Bond, Inc. of Hackensack, N.J., etc.

Figure 3:
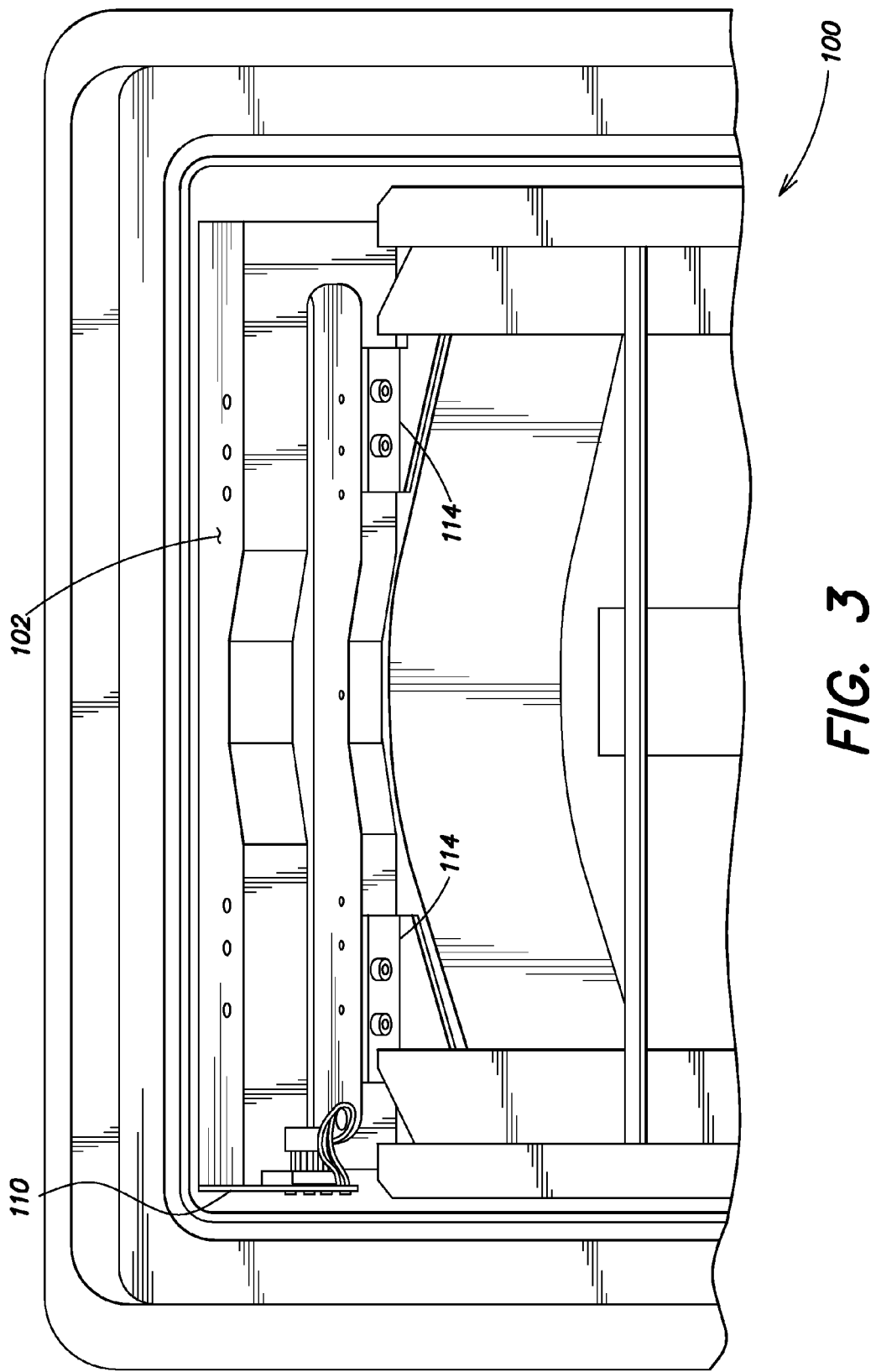
FIG. 3 is a front perspective view of an example embodiment of the apparatus of the present invention as installed in a substrate transfer chamber.

FIG. 3 illustrates a front perspective view of an embodiment of the apparatus 100 of the present invention as installed in a substrate transfer chamber. The support frame 102 may be secured to a substrate transfer chamber with brackets 114. The brackets 114 may be constructed of any appropriate material to facilitate heat dissipation from the support frame 102 to the substrate transfer chamber wall. Such materials may be stainless steel, other thermally conductive metals, or the like. Other materials may be used. The brackets 114 may serve to transfer heat from the support frame 102 so as to reduce the temperature of the support frame 102 and further protect the optical componentry 108 and the controller 110 from heat exposure and damage. In some embodiments, the controller 110 may be coupled to brackets 114 or may be set apart from brackets 114. When coupled to a bracket 114, the controller 110 may be insulated therefrom by insulating materials (e.g., nylon spheres, plastic spacers, etc.).

Figure 4:
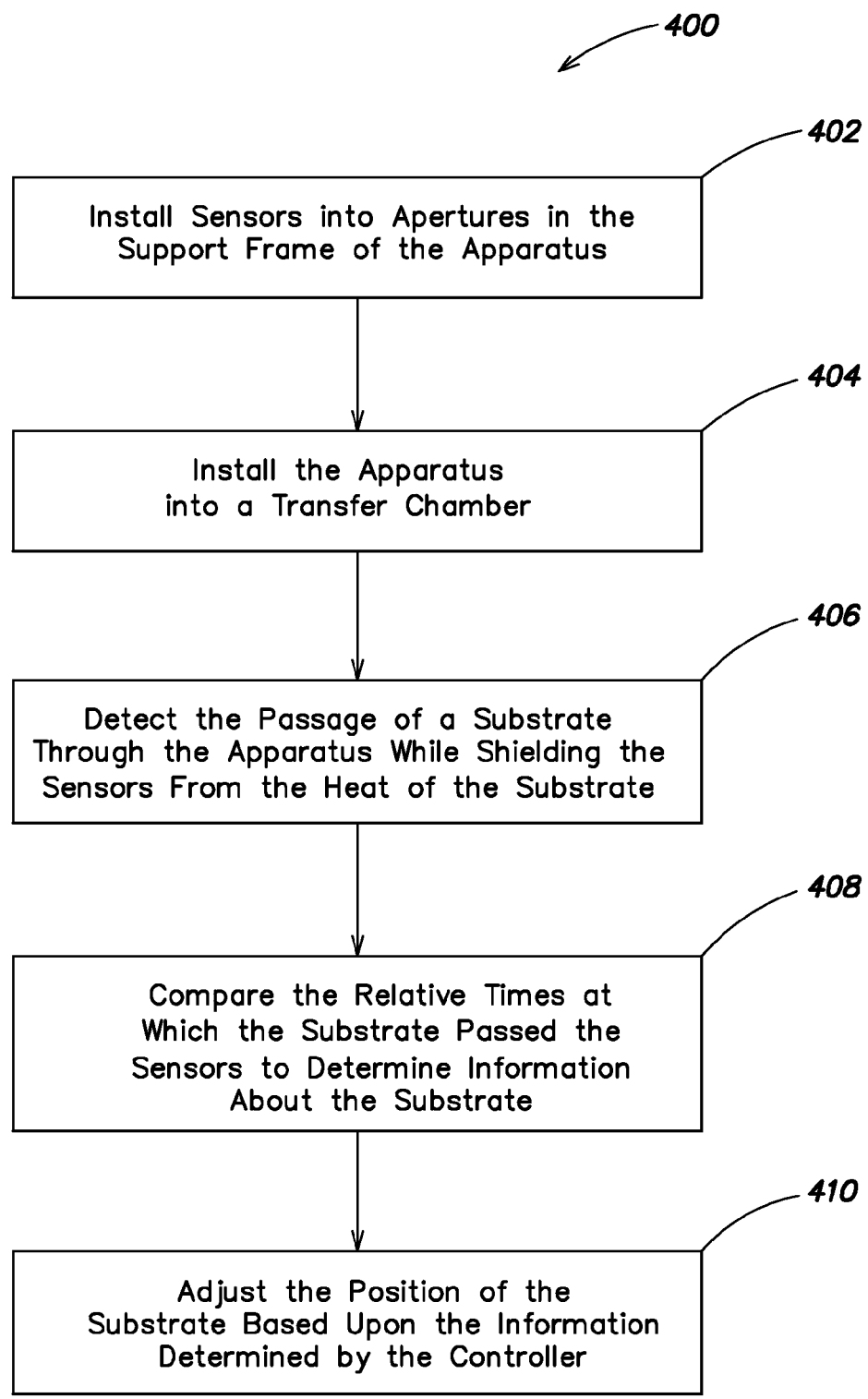
FIG. 4 is a flowchart depicting an example method of use of the example apparatus embodiment according to the present invention.

FIG. 4 depicts an exemplary method 400 of the present invention which includes the installation and use of the apparatus 100 in a transfer chamber. In Step 402, an array of sensors (e.g., optical devices 108) are installed into apertures in the support frame 102. Any practicable type of sensor adapted to detect a substrate may be employed. Connection wires between the sensors and the controller 110 may be threaded and potted in the wiring channels 112. The sensors may be aligned so as to be able to detect a substrate passing through the cut away region 104.

In Step 404, the apparatus 100 may be installed into a transfer chamber such that the cut away region 104 is aligned with a slit valve of the transfer chamber. Thermally conductive brackets 114 may be used to secure the apparatus 100 to the inside of the transfer chamber.

In Step 406, a hot substrate may be passed through the cut away region 104 while the sensors, shielded in the support frame 102, detect the substrate. The material of the support frame 102 may reflect the heat of the substrate (and/or heat from any other sources such as processing chambers) away from the sensors. In addition or alternatively, the support frame 102 and the brackets 114 may conduct the heat radiated by the substrate (and/or any other heat sources) away from the sensors into, for example, the walls of the transfer chamber.

In Step 408, the relative times at which the passage of the substrate was detected by the sensors may be compared by the controller 110 to determine information about the substrate (e.g., the size of the substrate, the relative position of the substrate, the center of the substrate, etc.) For example, if two sensors symmetrically disposed on either end of the support frame 102 indicate that a substrate passed both sensors at the same time (e.g., leading edges and/or trailing edges of the substrate were detected by both of the sensors at the same times), the controller 110 may determine that the center of the substrate (e.g., relative to a width dimension of the substrate) lies on a line that is equidistant between the two sensors. Further, in some embodiments, the timing of the edge detection signals may indicate a center location or line in a dimension parallel to the motion of the substrate. In another example, if two sensors symmetrically disposed on either end of the support frame 102 indicate that a substrate's edges passed the sensors at different times, the controller may determine that, e.g., the substrate is shifted closer to one of the sensors by an amount that may be computed based on the known shape of the substrate (e.g., the known curvature of the edge of a round substrate of a certain diameter).

In Step 410, the position of the substrate may be adjusted based upon the information determined by the controller 110 (e.g., to center the substrate). For example, an end effector may be used to shift the substrate's position by an amount equal to and opposite of the amount of shift determined in Step 408.

The foregoing description discloses only exemplary embodiments of the invention. Modifications of the above disclosed apparatus and method which fall within the scope of the invention will be readily apparent to those of ordinary skill in the art. For instance, the apparatus and methods described herein may be used in other sensing applications such as edge finding and may also be used in other processing environments such as substrate loading and/or processing chambers. The invention may also be realized utilizing other materials or configurations designed to provide a center finder which does not impede the substrate and is resistant to reflective radiant heat.

Accordingly, while the present invention has been disclosed in connection with exemplary embodiments thereof, it should be understood that other embodiments may fall within the spirit and scope of the invention, as defined by the following claims.

The invention claimed is:

1. An apparatus for sensing a substrate in a high temperature environment comprising:
a support frame having one or more apertures and a cut away region; and
one or more sensors positioned in and aligned by the one or more apertures and adapted to detect an edge of a substrate passed into or out of a substrate transfer chamber through the cut away region,
wherein the support frame is adapted to thermally shield the one or more sensors.

2. The apparatus of claim 1, wherein the support frame is secured to the substrate transfer chamber by thermally conductive brackets.

3. The apparatus of claim 1, wherein the support frame is coated to improve the heat reflectivity of the support frame.

4. The apparatus of claim 1, wherein the support frame is manufactured from material having a high relative heat reflectivity characteristic.

5. The apparatus of claim 1, wherein the cut away region is adapted to allow passage of a substrate.

6. The apparatus of claim 1, wherein a number of apertures sufficient to house enough sensors to detect a center of a substrate are included on an upper portion of the support frame.

7. The apparatus of claim 6, wherein a corresponding number of apertures present on the upper portion are present on a lower portion of the support frame.

8. The apparatus of claim 1, wherein the sensors are electrically coupled to a controller through wiring channels in the support frame.

9. The apparatus of claim 8, wherein wiring, electrical componentry, and the sensors are potted in the support frame with an encapsulation material.

10. The apparatus of claim 1, wherein wiring, electrical componentry, and the sensors are potted in the support frame with a light shielding material.

11. The apparatus of claim 1, further including a controller coupled to the sensors and mounted on the support frame.

* * * * *